United States Patent [19]

Losee et al.

[11] Patent Number: 4,613,402

[45] Date of Patent: Sep. 23, 1986

[54] METHOD OF MAKING EDGE-ALIGNED IMPLANTS AND ELECTRODES THEREFOR

[75] Inventors: David L. Losee, Fairport; James P. Lavine, Rochester, both of N.Y.

[73] Assignee: Eastman Kodak Company, Rochester, N.Y.

[21] Appl. No.: 750,204

[22] Filed: Jul. 1, 1985

[51] Int. Cl.$^4$ .................. H01L 21/306; B44C 1/22; C03C 15/00; C23F 1/02
[52] U.S. Cl. .................. 156/643; 29/576 R; 29/580; 29/591; 148/187; 148/190; 156/653; 156/657; 156/662; 357/24; 357/59; 357/91; 427/85; 427/93
[58] Field of Search .................. 427/85, 86, 88, 93, 427/94, 95; 357/24, 49, 59, 65, 91; 148/1.5, 187, 190; 29/569 R, 571, 578, 580, 591, 576 B, 576 R; 156/628, 643, 653, 657, 659.1, 662

[56] References Cited

U.S. PATENT DOCUMENTS

| | | | |
|---|---|---|---|
| 3,911,560 | 10/1975 | Amelio et al. | 29/578 |
| 4,035,906 | 7/1977 | Tasch et al. | 29/578 |
| 4,228,445 | 10/1980 | Tasch et al. | 357/24 |
| 4,229,752 | 10/1980 | Hynecek | 357/24 |
| 4,459,325 | 7/1984 | Nozawa et al. | 427/93 |
| 4,548,671 | 10/1985 | Kosonocky et al. | 156/643 |

OTHER PUBLICATIONS

"Novel Fine Line Patterning Technique for Submicron Devices Based on Selective Oxidation of Aluminum", 42, *Appl. Phys. Lett.*, No. 5, pp. 442–444 (3/1/83).

*Primary Examiner*—William A. Powell
*Attorney, Agent, or Firm*—Dana M. Schmidt

[57] ABSTRACT

There is disclosed a process particularly suited for making CCD's. The process comprises the steps of (a) depositing a layer of conductive material above a semiconductor substrate;
(b) forming a patterned mask above the conductive layer, the pattern exposing spaced-apart strip portions of the conductive layer;
(c) ion-implanting dopant strips into the substrate through the conductive layer strip portions exposed by the patterned mask;
(d) removing a portion of the mask but retaining the rest so as to expose the conductive layer over first portions of the substrate that contain an implanted dopant strip and over portions of the substrate adjacent to the first portions;
(e) forming on the conductive layer between the retained mask portions, and above the implanted dopant strips, strips of a material resistant to an etchant for the conductive material;
(f) removing the retained mask portions; and
(g) etching away the conductive layer where the latter is not covered with the etchant-resistant material so as to leave conductive strips overlying the implanted strips.

12 Claims, 18 Drawing Figures

METHOD OF MAKING EDGE-ALIGNED IMPLANTS AND ELECTRODES THEREFOR

FIELD OF THE INVENTION

This invention relates generally to a method for making semiconductor devices having dopants that are ion-implanted in a first set of strips under a first set of conductive strips that cooperate therewith. It particularly relates to a method for making charge-coupled devices.

BACKGROUND OF THE INVENTION

Solid-state imaging devices feature semiconductive pixels which collect minority carriers in response to photons absorbed by the pixels. The charges so generated are integrated by collecting them in a potential well. Charge transfer is achieved by transporting the collected charges by line and column shift registers into an output circuit, as is well known. Charge-coupled devices (hereinafter, "CCD's"), in turn, are a preferred form of solid-state imaging devices, and it is the making of these to which this invention is particularly directed. More specifically, CCD's feature MOS capacitors and preferably buried channels created by ion implantation. It is the method of ion implantation and of formation of the corresponding electrodes that governs whether or not the CCD imaging device will be highly efficient or not.

More specifically, in the field of two-phase charge-couple devices, it is essential that the devices be prepared in such a way as to obtain edge alignment between the potential well formed by an ion-implanted strip, and its overlying electrode. Failure to do so produces stray potential wells and barriers to efficient delivery of charges, and the performance of the device is degraded.

In U.S. Pat. No. 4,035,906, a process for forming CCD's is described wherein the mask used to ion-implant the first set of implanted strips is removed and is not available for the formation of the first set of polysilicon strips. Instead, the polysilicon strips are located by benchmarks not identified, so as to be staggered with respect to the implanted strips, FIGS. 2C and 2D. This requires that the portion of the implanted substrate covered by the polysilicon strips, be freed of its implanted ions by diffusing into the underlying substrate during the isolation oxidation step (occurring between FIGS. 2C and 2D). This is unsatisfactory as the inward diffusion is difficult to control. Some n-type dopant remains in the oxide, where it is not needed. A more serious drawback is that the dopant tends to excessively diffuse at the very edge of the underlying electrode, both downwardly and outwardly, as will be explained further hereinafter. This causes unwanted alteration of the potential well of both the first set of electrodes as well as of the second set that is formed adjacent thereto. The undesired potential alteration tends to produce charge transfer inefficiency.

It is difficult therefore, in such a technique to precisely control the out-diffusion. The difficulties are aggravated as the dimensions of the CCD decrease, a step necessitated by the overall reductions in integrated circuit dimensions. That is, a thinner isolation oxidation layer means a shorter oxidation time, and thus more sensitivity to stopping the out-diffusion exactly as needed.

SUMMARY OF THE INVENTION

We have discovered a process for accurately aligning the edge of the implanted barrier in a semiconductor substrate with the edge of its overlying electrode, as is necessary to the making of CCD's. This process is less sensitive to processing parameters than the prior art methods.

More specifically, there is provided such a method comprising the steps of (a) depositing a layer of conductive material above the semiconductor substrate;

(b) forming a patterned mask above the layer, the pattern exposing spaced-apart first strip portions of the conductive layer;

(c) ion-implanting dopant strips into the substrate through the conductive layer strip portions exposed by the patterned mask;

(d) removing a portion of the mask but retaining the rest so as to expose the conductive layer over first portions of the substrate that contain an implanted dopant strip and over portions of the substrate adjacent to the first portions;

(e) forming on the conductive layer between the retained mask portions, second strips of a material or of a thickness effective, when carrying out steps (f) and (g), to leave behind the second strips;

(f) removing the retained mask portions; and (g) etching away the conductive layer where the latter is not covered with the second strips.

In accord with another aspect of this invention, this method is particularly useful in the production of a two-phase CCD, wherein both a first set and a second set of p-type dopants are implanted under a first set and a second set of respective polysilicon electrode strips. This method comprises the following steps:

(a) depositing an overall layer of polysilicon onto a layer of $SiO_2$ on the silicon substrate;

(b) forming spaced-apart strips of masking material on the polysilicon layer that expose strip portions of the polysilicon layer;

(c) ion-implanting the first set of spaced-apart strips of dopant through the polysilicon strip portions that are exposed between the masking material, each of the implanted strips having an effective edge and an opposite other edge formed by the masking material, (d) removing that portion of the masking material from each of the masking material strips that is overlying the first implanted strips or adjacent to the edges of the first implanted strips; and (e) selectively converting the continuous polysilicon layer into a plurality of spaced-apart strips located in the spaces remaining between the remaining first masking material portions.

Thus, this invention advantageously features a method of obtaining more effective edge alignment of implanted dopants and overlying electrodes, wherever such may be critical, than was possible using the prior art.

It is a related advantageous feature of the invention that a method is provided for making CCD's with increased efficiency by eliminating undesired electron-trapping wells.

Other advantageous features will become apparent upon reference to the following "Description of the Preferred Embodiments", when read in light of the attached drawings.

DESCRIPTION OF THE PREFERRED EMBODIMENTS

Much of the discussion that follows concerns the construction of a CCD of the two-phase or virtual-phase type, using polysilicon electrode strips. In addition, the invention is applicable to any device in which a barrier implant (or well implant for p-type channel device) is desired below a conductive electrode strip such that the implant and electrode strip are accurately edge-aligned, whether or not the device is a CCD or the electrodes are polysilicon. For example, the invention is useful in any situation where the implanted dopant must be self-aligned with the edge of a gate, e.g., in making 4-phase CCD's, or CCD's with a lateral overflow drain.

The proper edge alignment of the implanted portions and the first set of conductive strips is achieved, in part, by the use of part of the masking material used for the ion implant, as the mask edge that is effective to position the edge of the conductive strips.

Figure 1:
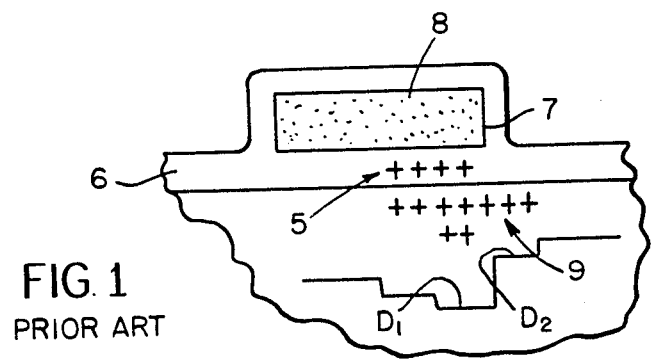
FIG. 1 is a fragmentary, partially schematic vertical section view through a semiconductor device, illustrating a prior art construction.

FIG. 1 is illustrative of the problem of the prior art. As the implanted dopant 5 diffuses out of the oxide layer 6, it tends to excessively diffuse at the portion adjacent edge portion 7 of the first polysilicon strips 8, creating an unwanted dip $D_1$ in the potential well sketched in the substrate. In addition, excessive diffusion occurs outwardly, at 9, to create an undesired dip $D_2$ in the well of the second strips of electrodes that are formed adjacent to the first strips.

The steps of the process are illustrated by the preferred embodiment of FIGS. 2A-2K. A semiconductor substrate 10, most preferably, p-type single crystal silicon having a buried n-type channel (not shown), has a layer 12 of gate oxide grown thereon, FIG. 2A. An overall layer 14 of silicon, such as doped polysilicon, is then deposited, followed, FIG. 2B, by a first overall mask layer 16 of $Si_3N_4$. The deposit of layers 14 and 16 is conventional, requiring no further details. A second overall mask layer 18 of oxide, such as deposited oxide, is then deposited to a suitable ion-masking depth, preferably about 5000 Å. Layers 16 and 18 are patterned by the use of conventional photoresist and etch techniques to form mask strips 20, leaving exposed portions of the underlying layer 14. Strips 20 are preferably non-converging, with predetermined spacings between them.

Thereafter, a third layer 30 of suitable masking material is deposited overall, with a thickness that renders layer 30 non-planar. That is, portions 32 of layer 30 that are in contact with strips 20 preferably project a distance y above the portions of layer 30 lying between such strips 20. The height of such projections is selected to insure that, when the dotted portions of layer 30 are etched away, FIG. 2B, tail portions 34 will remain due to the greater thickness that occurs on the downward side of strips 20. A representative example of y is 5000 Å. Any material having such a property is useful, for example, chemical vapor deposited $SiO_2$, which produces the projection y when coated at a nominal thickness of 5000 Å. In addition, the material should provide sufficient boron ion stopping power, FIG. 2C, for tail portions 34.

Figure 2A:
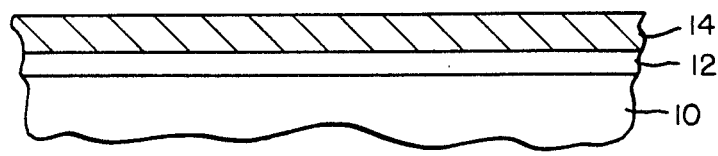
FIGS. 2A through 2K are fragmentary, partially schematic vertical section views through a semiconductor device, illustrating respectively the successive steps of the invention.
Figure 2B:
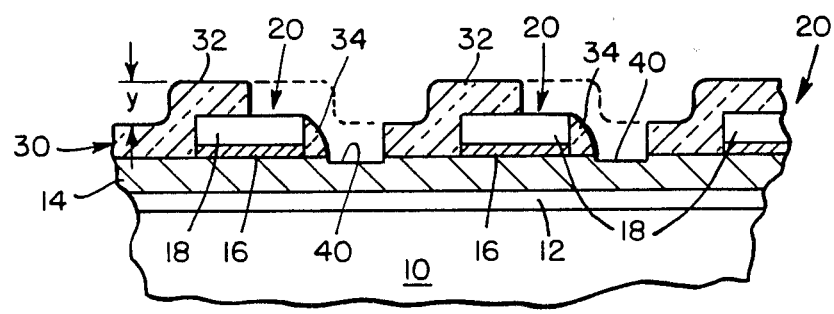
Figure 2C:
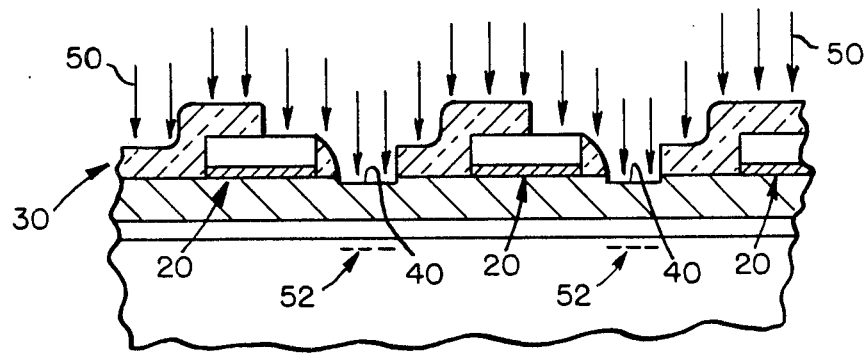
Figure 2D:
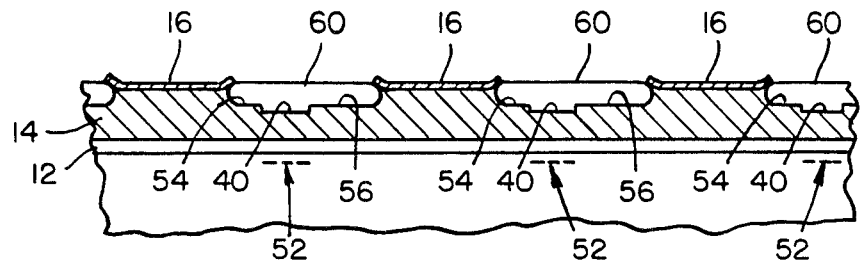

Several etching techniques for such a material are suitable to remove the dotted portions, FIG. 2B. For example, reactive ion etching or plasma etching through an exposed and developed photoresist, not shown, can be used. It is a characteristic of such etching that recesses 40 are produced in polysilicon layer 14 as well, inasmuch as polysilicon is not a perfect etch stop for such etches. Such recesses are preferably about 100 Å or less.

As an alternative to using $SiO_2$ for layer 30, and a photoresist over that, layer 30 can itself be a photoresist if the resist has sufficient ion-stopping power to keep the implanted boron from reaching substrate 10.

At this point, the mask for the first ion implanting step is completely patterned. Ion implanting of the first set of barrier strips occurs, FIG. 2C, by conventional ion implanting of an appropriate dopant, such as boron, shown schematically by arrows 50 The implant energy, conventionally applied, is selected to insure the boron is implanted below the interface between layers 10 and 12, that is, to create half of the desired barrier regions, for example, energies at or below 200 keV are usually sufficient. The implanted strips are indicated by the dash lines 52. However, the mask created by oxide 30 and strips 20 is effective in keeping out the dopant everywhere else. Thus, the ion-implanted strips are coincident and aligned with recesses 40, and modify the potential at those portions of the device.

Thereafter all but the $Si_3N_4$ portions 16 of the aforedescribed mask is removed. This is readily achieved using, for example, buffered HF solutions to remove the deposited oxides. This exposes not only the recessed portions 40 of the polysilicon, but also the portions 54 and 56 adjacent thereto, FIG. 2D, which previously had contacted the oxide 30. Strips 60 of an etch-resistant material such as thermally grown $SiO_2$ or a metal silicide are formed on these exposed surfaces 40, 54 and 56, to act as an etchant-resistant material in the patterning of the polysilicon. Such oxide strips are formed where the polysilicon is not covered by the portion 16 of the larger mask used previously to delineate the location of the implanted strips 52. Conventional processes of forming strips 60 are useful. If strips 60 are a metal silicide, this is achieved by depositing overall a layer of the metal for that metal silicide, for example, Ti. The device is then annealed at a temperature sufficient to produce the silicide, but only where the metal contacts the exposed polysilicon layer. The unreacted metal is then etched away, leaving a configuration of that of FIG. 2D.

Figure 2E:
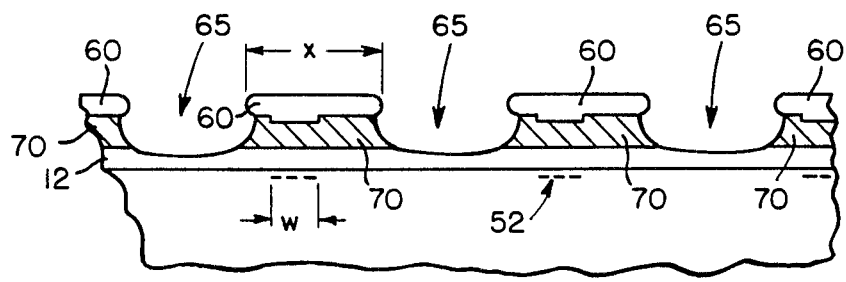
Figure 2F:
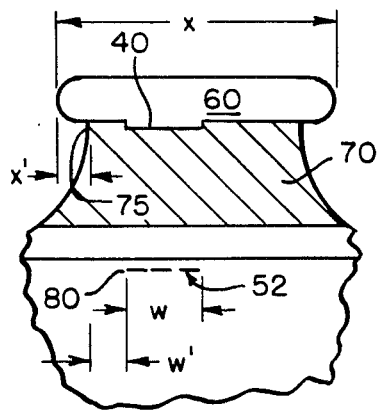

Thereafter, the retained portions 16 of the previous mask are removed, such as by hot $H_3PO_4$, or by a highly anisotropic reactive ion etch. This exposes the polysilicon between the $SiO_2$ strips 60 to an appropriate etchant, whereas the $SiO_2$ strips 60 are etchant resistant and protect the underlying polysilicon. Such an appropriate etchant includes plasma or reactive ion etching processes. FIGS. 2E and 2F illustrate the result of etching away such exposed conductive polysilicon between strips 60. The grooves 65 that are formed may undercut the strips 60 slightly. Left behind are strips 70 of the conductive polysilicon.

FIG. 2F illustrates more clearly the features and dimensions of such strips 60 and 70. The total width of strip 60 is "x". The etching produces a surface 75 on one side of strips 70. Depending on the etchant used, surface 75 undercuts protective SiO$_2$ strip 60, and the amount of undercut, measured from the vertical portion of surface 75, is "x'". The implanted barrier strip 52 has a width "w". Edge 80 of strip 52 may be spaced from vertical alignment with the vertical part of surface 75 by a distance w'. Representative values for the aforementioned dimensions are as follows:

x = 2 to 20 μm
w = 1 to 7 μm
x' = 0 to 3000 Å
w' = 500 to 2000 Å

(x' is zero if an etching process is used that produces no undercut.)

Strips 60 may then be removed, for example, by using buffered HF as an etchant where such strips are silicon dioxide. If strips 60 are a metal silicide, they may be retained.

Thereafter, each entire polysilicon strip 70 is oxidized, such as by heating in an appropriate atmosphere. A representative example is one in which strips 70 are heated to a temperature of about 950° C. for about 20 minutes in an ambient atmosphere containing H$_2$O. The result is an isolation oxide coating 90, FIG. 2G. Such heating may cause edge 80 of strip 52 to diffuse outwardly slightly depending on the severity of the heating, and the slope of wall surfaces 75 to change. For most heating steps of this type, after the diffusion, edge alignment is still present for edge 80 compared to the vertical portions of surface 75 of polysilicon strip 70, FIG. 2G.

Figure 2G:
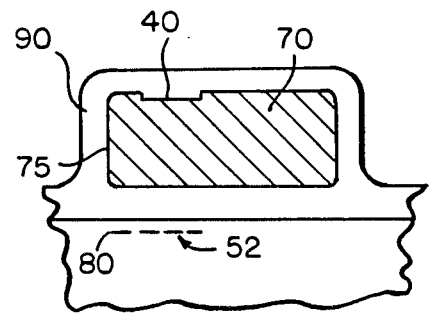

Recesses 40 may either extend all the way to surface 75, or stop short thereof, as shown in FIG. 2G. In the former case, the difference in vertical alignment between the edges of implanted strip 52 after the oxidation step, and the edge of wall surface 75 is negligible.

Other alternatives can be used for the implant mask and/or for the etchant-resistant material used to form strips 70 of the polysilicon. If the metal that is deposited to form the etchant-resistant strips 60 is tungsten, and if the strips 18 remain as SiO$_2$ as originally described, the tungsten will deposit, out of WF$_6$ vapor at 400° to 500° C., only on the exposed polysilicon surfaces 40, 54 and 56. Removal of the SiO$_2$ strips 20 and strips 16 leaves the tungsten contacting the polysilicon only at such surfaces 40, 54 and 56. Subsequent etching then produces the result of FIG. 2E, where strips 60 are tungsten and are removed prior to the oxidation step that forms the result of FIG. 2G.

Figure 2H:
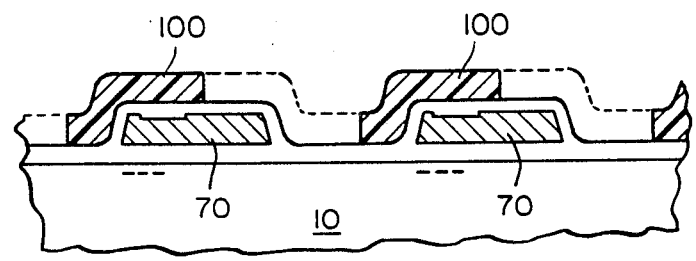
Figure 2I:
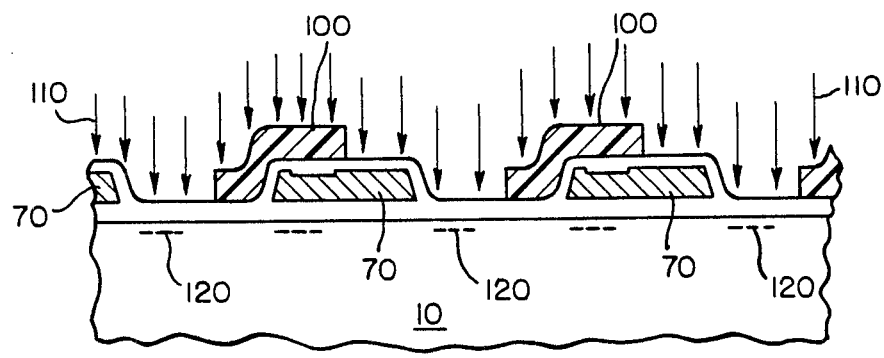

At this point, only a first set of implanted barrier strips has been edge-aligned with the corresponding overrlying electrodes. A two-phase CCD requires a second set. The second set of implants and overlying electrodes are aligned as follows: FIG. 2H, a layer 100 of material is deposited overall, substantially in the same manner as layer 30 of FIG. 2B. This material is patterned the same as was layer 30. Ion implanting occurs via arrows 110, FIG. 2I, to implant strips 120 only at the portions of the substrate not covered by the material in layer 100. (No implanting occurs under the exposed polysilicon strips 70 because the implant energy for the second implant is lower than that for the first implant, for example, by about 150 keV.) The strips 100 are then removed, FIG. 2J. The second set of polysilicon strips are then deposited, first as an overall layer, which then is patterned to leave the spaced-apart strips 130, FIG. 2K. Because strips 120 automatically are edge-aligned with the *outside* surface of polysilicon strips 70, due to their implantation using strips 70 as a mask, these strips are vertically aligned at their edges 122 with the respective edges of electrode strips 130.

The first set of strips 70 are wired to a common terminal 270, while the second set of strips 130 are wired to a common terminal 330, thus completing the two-phase CCD.

Figure 2J:
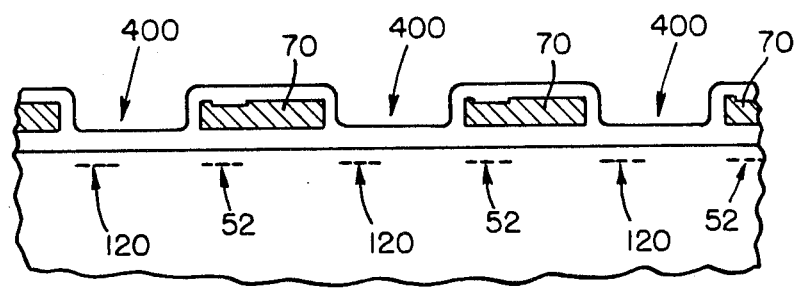
Figure 2K:
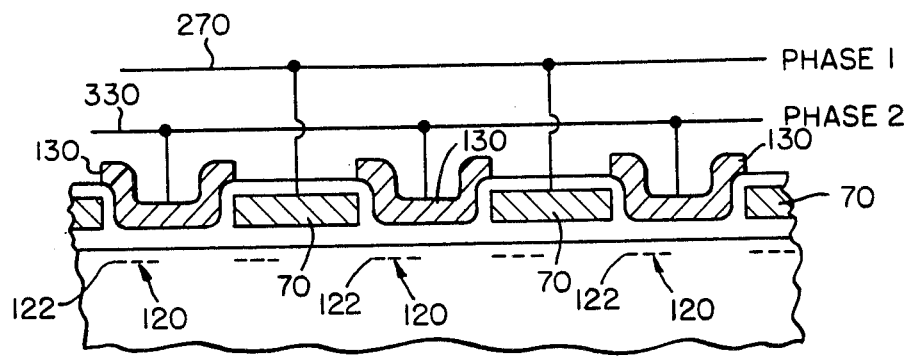

Once the proper edge alignment has been achieved for the first set of implant strips and their respective overlying electrodes, a virtual-phase electrode construction is possible, using only the first set of thus-formed electrodes. This is accomplished by picking up the process as it is completed as shown at FIG. 2J, and by the following additional steps: (1) ion implanting through the entire exposed groove 400, FIG. 2J, strips 410 of acceptor dopants such as boron that extend the full width of grooves 400, FIG. 3. (2) This is then followed by an optional heating step, for example, at 950° C. for 30 minutes, which diffuses strips 120 and 410 deeper into the substrate. (3). Thereafter, a final strip 500 of donor dopant such as arsenic is implanted through grooves 400. The result is the series of stepped potential wells schematically indicated by line 510.

Figure 4:
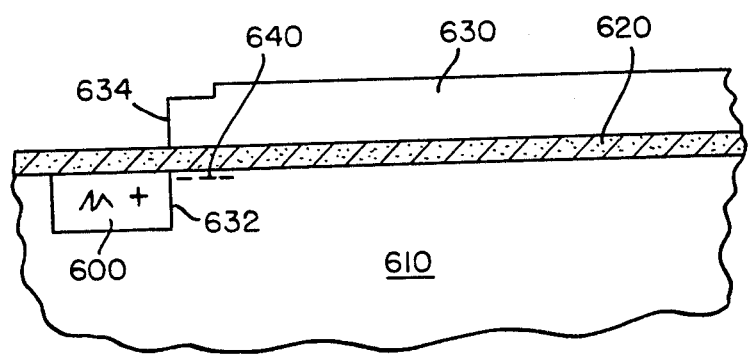
FIG. 4 is a fragmentary section view of a CCD device, taken generally at 90° to the views of FIGS. 2A-2K.

As noted above, the process can be used to edge-align an implanted barrier used to create a lateral overflow drain. Such a structure is shown in FIG. 4. Portion 600 of the substrate 610 is the implanted drain, connected to a voltage source not shown. Layer 620 is an isolation oxide layer, and elevated ridge 630 seen in the background is the oxide-coated polysilicon strip comprising one of the CCD electrodes. The afore-described process is effective in edge-aligning edge 632 of implant barrier 600, with edge 634 of the polysilicon strip. The implant so created is schematically shown as dashed line 640 "within" the substrate.

Figure 5:
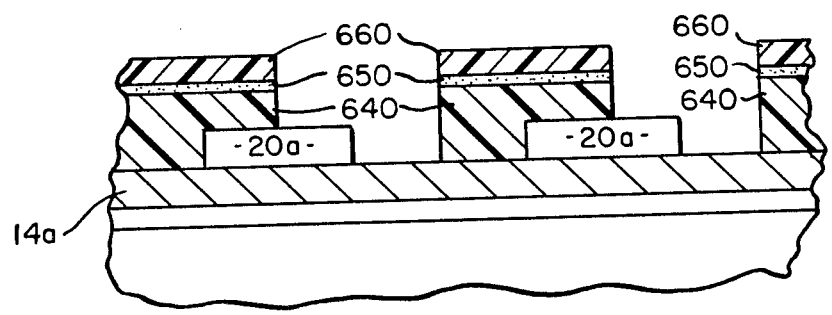
FIG. 5 is a fragmentary sectional view similar to FIG. 2B, but illustrating an alternate embodiment.

Still another alternative to using tail portions 34 is shown in FIG. 5. This embodiment is particularly useful if the process minimizes subsequent heating as would cause lateral diffusion of the implanted dopant strip. Parts similar to those previously described bear the same reference numeral, to which the distinguishing suffix "a" is appended. Thus, a layer 14a of polysilicon is provided with strips 20a, as before. A multilayer resist mask is then used, comprising a planarizing layer 640, a barrier layer 650 such as a spun-on-glass, and a relatively thin photoresist layer 660, as is conventional in such a mask. By exposing and developing first layer 660 and etching layer 650, layer 640 can be anisotropically etched to produce the results of FIG. 5. The rest of the processing follows the procedures of the previous embodiment, using the appropriate etchants for strip removals.

Figure 6:
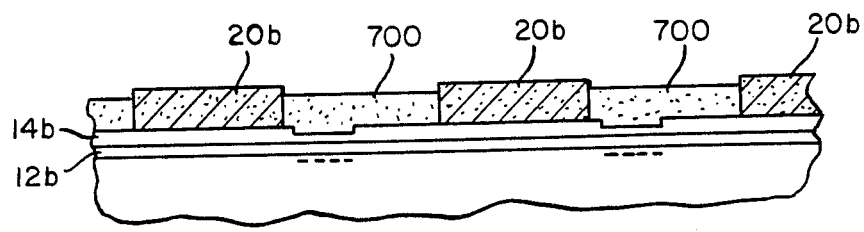
FIGS. 6-8 are fragmentary sectional views similar to FIGS. 2A-2C, except that another embodiment is illustrated.
Figure 7:
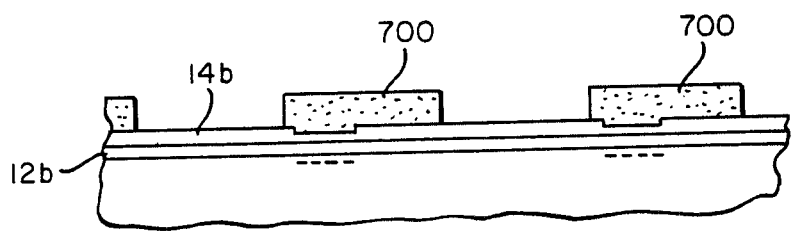
Figure 8:
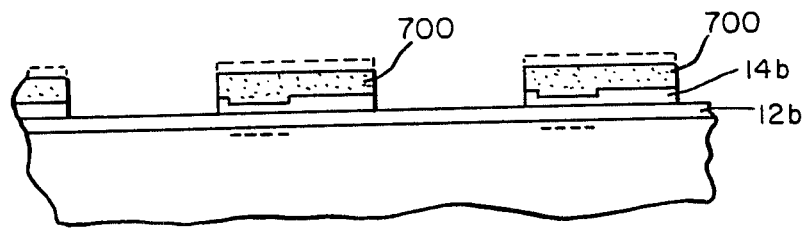
Figure 3:
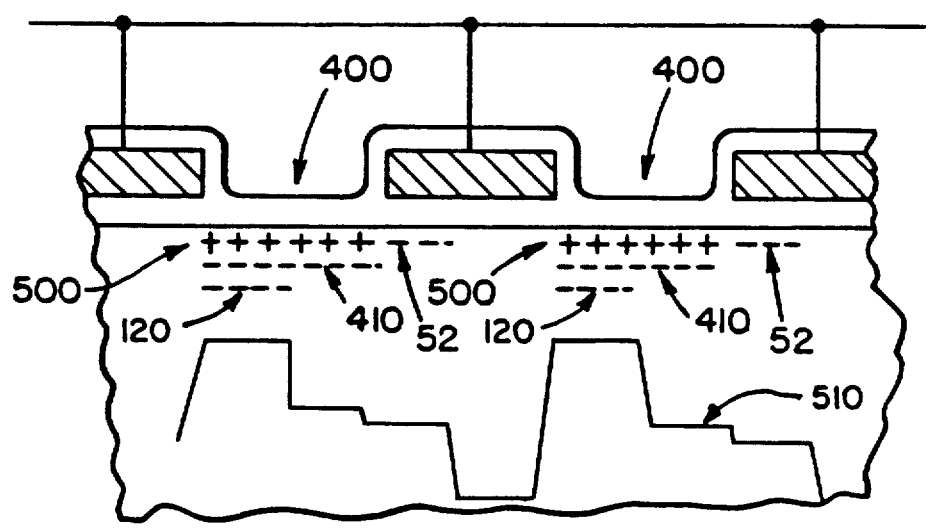

Yet another method is available for forming strips 70 of polysilicon that are edge-aligned with the implanted dopant strips therebelow. This method is illustrated in FIGS. 6-8 Parts similar to those previously described bear the same reference numeral to which the distinguishing suffix "b" is appended. This method starts out with the same steps as in FIGS. 2A–2C of the previous embodiment, except that layer 14b is a very thin layer (1000 Å or less) of silicon, for example, amorphous silicon, formed on oxide layer 12b, and strips 20b are preferably all Si₃N₄. At this point, strips 700 of polysilicon or amorphous silicon are deposited on the layers 12b and 14b exposed between strips 20b. Most importantly, these strips have a thickness sufficient to survive the etching discussed below. Preferential deposition of silicon at these locations and not on the Si₃N₄ is obtainable by vapor depositing the silicon from SiCl₄+H₂ at a pressure of about 1/100 bar. The silicon as deposited can be already doped, or doping can be achieved by ion implantation. Thereafter, strips 20b are selectively etched off, FIG. 7. At this point, the portions of layer 14b exposed between strips 700 is etched away using plasma or reactive ion etching. Because strips 700 are of sufficient thickness compared to layer 14b, the result of this etching step is that only the dotted portion of strips 700, FIG. 8, is removed.

Thereafter, the processes of the previously described embodiment are useful to complete the CCD.

Alternatively, if strips 20b comprise SiO₂ and are thick enough for a lift-off process, the silicon strips 700 can be deposited both on and between strips 20b (not shown), and the portions on strip 20b are removed when the strips 20b are etched away.

EXAMPLE

The following example further illustrates the scope of the invention.

In accordance with the procedure shown in FIGS. 2A–2D, strips 16 of Si₃N₄, having a thickness of 500 Å were formed on a 3500 Å polysilicon layer 14. Thereafter strips 18 of SiO₂, at a thickness of 5000 Å, were deposited. These were then etched through a mask, using reactive ion etching, to form strips 20, and then covered with an overall layer 30 of deposited SiO₂ having a thickness of 5000 Å. Layer 30 was reactive-ion etched through a photoresist mask exposed and developed as discussed above, to leave tail portions 34. Dopant implantation featured boron using 200 keV of energy and an exposure gap between oxide strips 32 of 3 μm. The deposited oxide layers were then removed using a buffered HF etchant, leaving behind the thin Si₃N₄ strips. Etchant-resistant strips 60 were formed by oxidizing the polysilicon left exposed by the buffered HF etchant. Thereafter, nitride strips 16 were removed by phosphoric acid at 150° C., for 30 min, and the exposed polysilicon strips were etched using an SF₆-containing plasma etching process.

For comparative purposes, the process of FIGS. 2A–2F of U.S. Pat. No. 4,035,906 was carried out to produce a CCD similar to that produced above. That is, several 25 ohm-cm p-type wafers were processed through standard gettering and channel stop procedures. Thereafter, phosphorus was implanted blanket-wise at a concentration of $1.2 \times 10^{12}$ cm$^{-2}$, by a 150 keV ion implant to form a buried channel structure.

A layer of silicon dioxide of 1000 Å thickness was then grown at 950° C. in a wet ambient atmosphere. A layer of photoresist was deposited over this, and patterned. Arsenic was implanted into the oxide through the openings of the resist, using ion energy of 80 keV to implant a concentration of $1.3 \times 10^{13}$ cm$^{-2}$, duplicating the condition of FIG. 2B of U.S. Pat. No. 4,035,906. The strips of photoresist were then removed.

Next, a layer of polysilicon was deposited overall, at 620° C., and phosphorus doped at 900° C. for 30 minutes. This polysilicon layer was then patterned to form a structure essentially duplicative of that of FIG. 2C of U.S. Pat. No. 4,035,906.

Thereafter, the layer of oxide between the polysilicon strips was etched, to remove the As implant between polysilicon strips. Following the etch step, isolation oxide was formed and the remaining As implant caused to diffuse into the substrate. This was achieved by heating the wafers at 950° C. for 20 min in a wet ambient atmosphere, to duplicate the conditions shown as FIG. 2D of U.S. No. 4,035,906.

Finally, the second phase electrodes were made as described in U.S. Pat. No. 4,035,906, and a final anneal at 1050° C. for 30 min served to further drive the As into the substrate.

The presence or absence of undesired trapping wells was then determined both for the above example of the invention and the comparative example, by the following procedure:

At gate voltages of 0 volts, the potential well in the phase 1 storage region of the comparison wafers was found to be 12.8 eV. In the phase 1 transfer region, the potential was 5.2 eV Most importantly, at the boundary between the phase 1 storage region and the phase 2 transfer region, there was a well that was approximately 3 eV deep and 1 μm wide. This latter produced poor charge transfer efficiency.

In contrast, the above-noted Example of this invention was found to have no such boundary well between the phase 1 storage region and the phase 2 transfer region or between the phase 1 transfer region and phase 2 storage region.

The invention has been described in detail with particular reference to preferred embodiments thereof, but it will be understood that variations and modifications can be effected within the spirit and scope of the invention.

What is claimed is:

1. A method for accurately aligning strips of implanted dopant in a semiconductor substrate with conductive strips above the implant strips, comprising the steps of
   (a) depositing a layer of conductive material above said semiconductor substrate;
   (b) forming a patterned mask above said layer, the pattern exposing spaced-apart first strip portions of said conductive layer;
   (c) ion-implanting said dopant strips into said substrate through the conductive layer strip portions exposed by said patterned mask;
   (d) removing a portion of said mask but retaining the rest so as to expose said conductive layer over first portions of said substrate that contain an implanted dopant strip and over portions of said substrate adjacent to said first portions;
   (e) forming on said conductive layer between said retained mask portions, second strips of a material or of a thickness effective, when carrying out steps f) and (g), to leave behind said second strips;
   (f) removing said retained mask portions; and
   (g) etching away said conductive layer where the latter is not covered with said second strips.

2. A method as defined in claim 1, wherein said conductive material of step (a) comPrises silicon.

3. A method as defined in claim 2, wherein said strip portions of step (b) are polysilicon, and wherein said step (e) comprises the step of converting the surface portion of said polysilicon between said retained portions, to a material that is resistant to said etching step (g).

4. A method as defined in claim 3, wherein said converting step comprises converting polysilicon into $SiO_2$ at the surface.

5. A method as defined in claim 3, wherein said converting step comprises converting polysilicon into a metal silicide at the surface.

6. A method as defined in claim 2, wherein said layer deposited in said step (a) is polysilicon, and wherein step (e) comprises the step of forming intervening strips of conductive polysilicon between said retained mask portions that are of a thickness in excess of the thickness of said deposited silicon layer, whereby after said etching step (g) there remains an amount of said intervening strips of polysilicon to act as said conductive strips aligned with said strips of implanted dopant.

7. A method as defined in claim 1, wherein said patterned mask formed by step (b) exposes strips of said conductive layer that have a width that is less than the width of said second strips formed by step (e).

8. A method as defined in claim 1, and further including the steps of
    (h) oxidizing the surface of said second strips;
    (i) forming a patterned mask on top of a portion of said oxidized second strips and on top of portions of the underlying substrate adjacent to said oxidized second strips, so as to leave exposed strip portions of oxidized underlying substrate; and
    (j) ion-implanting a second set of dopant strips into said substrate at strip portions of underlying substrate exposed by said step (i).

9. A method as defined in claim 8, and further including the step of forming a second set of conductive strips insulated from said first set of conductive strips, said second set being disposed above said second set of implanted strips and aligned at one edge thereof each with an edge of an implanted strip of said second set.

10. A method as defined in claim 1, wherein said step (b) comprises the steps of (i) forming a first and a second layer of ion-masking material; (ii) patterning said layers to expose underlying portions of said conductive material; (iii) depositing over said layers of masking material and said exposed underlying conductive material, a third layer of masking material at a depth that renders said third layer non-planar, and (iv) removing portions of said third layer sufficient to expose at least said first strip portions of said conductive layer.

11. A method as defined in claim 10, wherein said step (iv) leaves behind tail portions of said third layer.

12. In a method for producing a two-phase CCD, including the steps of ion-implanting into a silicon substrate a first set of spaced-apart strips of a p-type dopant under a first set of spaced-apart electrode strips of polysilicon so that said implanted strips do not extend beyond the edges of said polysilicon strips, and of ion-implanting a second set of spaced-apart strips of said dopant under a second set of spaced-apart electrode strips of polysilicon;

the improvement wherein said first set of implanted strips and said first set of polysilicon strips are formed by the steps of
(a) depositing an overall layer of polysilicon onto a layer of $SiO_2$ on said silicon substrate;
(b) forming spaced-apart strips of masking material that expose strip portions of said polysilicon layer;
(c) ion-implanting said first set of spaced-apart strips of dopant through the strip portions of said polysilicon layer that are exposed between said masking material, each of said implanted strips having edge and an opposite other edge formed by said masking material;
(d) removing that portion of said masking material from each of said masking material strips that is overlying said first implanted strips or is adjacent to said edges of said first implanted strips; and
(e) selectively converting said continuous polysilicon layer into a said first set of polysilicon strips, located in the spaces remaining between said remaining first masking material portions;

whereby said polysilicon strips each are (a) disposed directly above one of said implanted strips, (b) with an edge that is effectively aligned with said effective edge of said implanted strip.

* * * * *

UNITED STATES PATENT AND TRADEMARK OFFICE
CERTIFICATE OF CORRECTION

PATENT NO. : 4,613,402

DATED : September 23, 1986

INVENTOR(S) : David L. Losee; James P. Lavine

Figure 3:
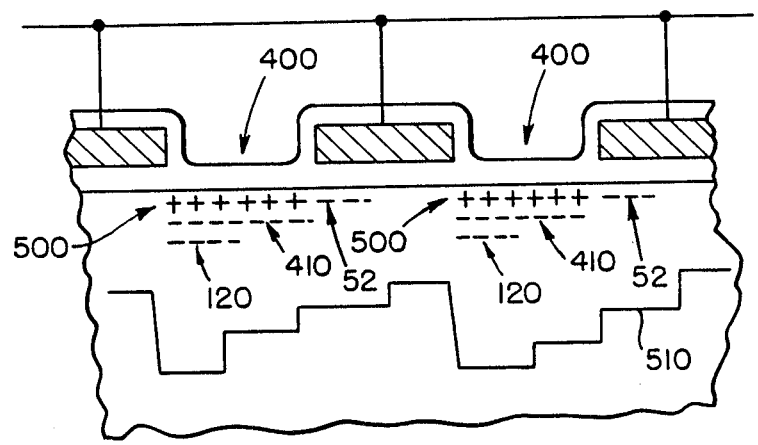
FIG. 3 is a view similar to FIG. 2K, except showing as the final device, a virtual-phase CCD produced by the method of this invention.

It is certified that error appears in the above-identified patent and that said Letters Patent are hereby corrected as shown below:

Figure 3, substitute therefor the attached corrected Figure 3.

Column 10, Line 29 should read -- having an effective --

Signed and Sealed this

Eighth Day of September, 1987

Attest:

DONALD J. QUIGG

Attesting Officer        Commissioner of Patents and Trademarks